US010312383B2

(12) United States Patent
Su et al.

(10) Patent No.: US 10,312,383 B2
(45) Date of Patent: Jun. 4, 2019

(54) HIGH-FREQUENCY PHOTOELECTRIC DETECTOR ENCAPSULATION BASE TANK-PACKAGED BY USING MULTI-LAYER CERAMIC

(71) Applicant: WUHAN TELECOMMUNICATION DEVICES CO.,LTD., Wuhan, Hubei Province (CN)

(72) Inventors: Zhicheng Su, Wuhan (CN); Tuquan Chen, Wuhan (CN); Xuyu Song, Wuhan (CN)

(73) Assignee: WUHAN TELECOMMUNICATION DEVICES CO., LTD., Wuhan, Hubei Province (CN)

( * ) Notice: Subject to any disclaimer, the term of this patent is extended or adjusted under 35 U.S.C. 154(b) by 212 days.

(21) Appl. No.: 15/316,985

(22) PCT Filed: Dec. 19, 2014

(86) PCT No.: PCT/CN2014/094320

§ 371 (c)(1),
(2) Date: Dec. 7, 2016

(87) PCT Pub. No.: WO2016/008264

PCT Pub. Date: Jan. 21, 2016

(65) Prior Publication Data

US 2017/0125611 A1 May 4, 2017

(30) Foreign Application Priority Data

Jul. 17, 2014 (CN) .......................... 2014 1 0340530

(51) Int. Cl.
*H01L 31/02* (2006.01)
*H01L 31/0203* (2014.01)
(Continued)

(52) U.S. Cl.
CPC ........ *H01L 31/0203* (2013.01); *H01L 23/055* (2013.01); *H01L 23/49833* (2013.01);
(Continued)

(58) Field of Classification Search
CPC ............. H01L 23/49833; H01L 23/055; H01L 31/0203
See application file for complete search history.

(56) References Cited

U.S. PATENT DOCUMENTS

2009/0196626 A1* 8/2009 Nakao ....................... G01J 1/02 398/135
2010/0006863 A1* 1/2010 Ban ..................... H01L 31/0203 257/81

FOREIGN PATENT DOCUMENTS

CN 1790845 A 6/2006
CN 1811505 A 8/2006
(Continued)

*Primary Examiner* — Stephen W Smoot
*Assistant Examiner* — Sun Mi Kim King
(74) *Attorney, Agent, or Firm* — Muncy, Geissler, Olds & Lowe, P.C.

(57) ABSTRACT

The present invention applies to the technical field of photoelectric detectors and provides a high-frequency photoelectric detector encapsulation base can-packaged by using a multi-layer ceramic, comprising a laminated multi-layer ceramic substrate, wherein the multi-layer ceramic substrate is welded with pins at a bottom and provided with a metal ring at a top; an upper surface and a lower surface of each layer of the ceramic substrate are both plated with a conductive metal layer; circuit connection holes are distributed in each layer of the ceramic substrate; the upper surface of the multi-layer ceramic substrate is provided with two power contacts and two differential signal contacts; and the power contacts and the differential signal contacts penetrate through each layer of the ceramic substrate to be connected to the corresponding pins. The photoelectric detector encap-
(Continued)

sulation base is a tank-type base of a multi-layer ceramic structure, the upper and lower surfaces of each layer of the ceramic substrate are electroplated with a conductive metal layer to constitute a co-plane waveguide structure; and a differential signal transmission design being adopted in a high-speed signal line can solve the transmission problem of a signal of higher than 20 GHz in bandwidth, with a small transmission loss.

9 Claims, 5 Drawing Sheets

(51) Int. Cl.
*H01L 23/498* (2006.01)
*H01L 23/055* (2006.01)

(52) U.S. Cl.
CPC .. *H01L 31/02002* (2013.01); *H01L 31/02005* (2013.01); *H01L 31/02016* (2013.01)

(56) References Cited

FOREIGN PATENT DOCUMENTS

| | | | |
|---|---|---|---|
| CN | 1879268 | A | 12/2006 |
| CN | 104124285 | A | 10/2014 |

* cited by examiner

HIGH-FREQUENCY PHOTOELECTRIC DETECTOR ENCAPSULATION BASE TANK-PACKAGED BY USING MULTI-LAYER CERAMIC

TECHNICAL FIELD

The present invention belongs to the technical field of photoelectric detectors, and in particular relates to a high-frequency photoelectric detector encapsulation base tank-packaged by using a multi-layer ceramic.

BACKGROUND

With the high-speed development of photo-communications, the demands for an optical transceiver module of 100 G will gradually rise in the next few years. As one of the core devices in an optical transceiver module, a detector component also raises great market demands. In consideration of cost and size, a TO (tank-type) encapsulation device with a bandwidth of higher than 20 GHz and a transmission rate up to 28 Gbps also needs to be developed urgently. For a traditional TO base, kovar is used as a main body, and a tubular column is assembled onto the main body by means of a glass welding process to act as an electric connection interface. With a impedance matching design, this traditional TO base exhibits a good property when transmitting a signal of less than 20 GHz, but is subjected to a great loss when being applied to a signal of higher than 20 GHz, thereby failing to meet the application requirements.

SUMMARY

In view of the technical problem as described above, an object of the present invention is to provide a high-frequency photoelectric detector encapsulation base tank-packaged by using a multi-layer ceramic, so as to solve the technical problem that the traditional TO base fails to transmit a signal of higher than 20 GHz.

The present invention employs the following technical solution:

A high-frequency photoelectric detector encapsulation base can-packaged by using a multi-layer ceramic comprises a laminated multi-layer ceramic substrate, wherein the multi-layer ceramic substrate is welded with pins at a bottom and provided with a metal ring at a top; an upper surface and a lower surface of each layer of the ceramic substrate are both plated with a conductive metal layer; circuit connection holes are distributed on each layer of the ceramic substrate, and all the layers of the ceramic substrate are combined and fixed into an integral body via the circuit connection holes; and the upper surface of the multi-layer ceramic substrate is provided with two power contacts and two differential signal contacts; the power contacts and the differential signal contacts penetrate through each layer of the ceramic substrate to be connected to the corresponding pins; and ground pins are drawn out from the lower surface of the multi-layer ceramic substrate.

The present invention has the following beneficial effects: the photoelectric detector encapsulation base according to the present invention is a TO-type base having a multilayer ceramic structure, wherein the upper and lower surfaces of each layer of the ceramic substrate are electroplated with a conductive metal layer to constitute a co-plane waveguide structure; and a differential signal transmission design adopted in a high-speed signal line can solve the transmission problem of a signal of higher than 20 GHz in bandwidth, with a small transmission loss and the possibility of meeting the requirement of a coaxial photoelectric detection device with a single channel of higher than 20 GHz.

DETAILED DESCRIPTION

To make the objectives, technical solutions and advantages of the present invention clearer and more explicit, the present invention will be further illustrated in detail with reference to the accompanying drawings and embodiments. It will be appreciated that the embodiments as described here are only intended to explain, rather than to limit, the present invention.

To illustrate the technical solution of the present invention, detailed description is given hereinafter with reference to specific embodiments.

Figure 1:
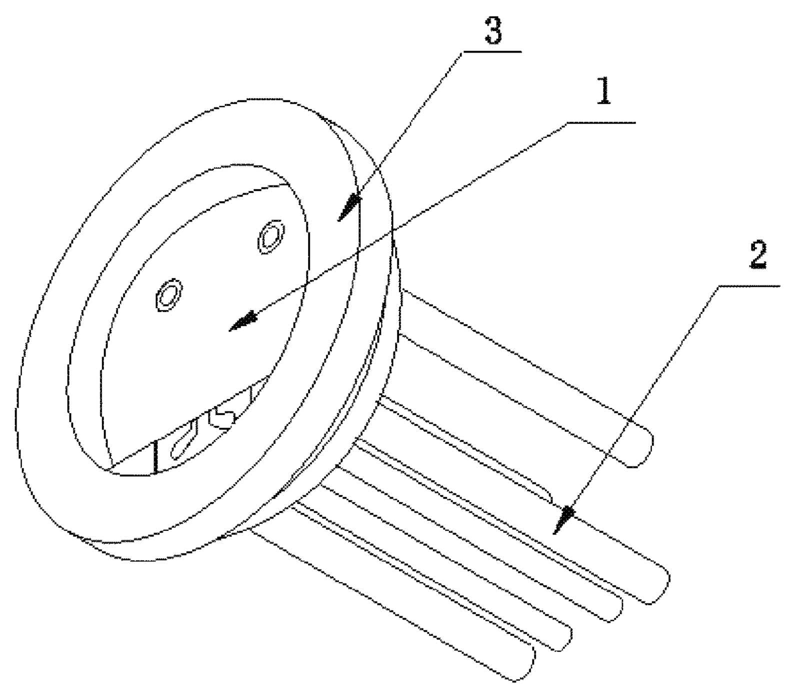
FIG. 1 is a perspective view of a high-frequency photoelectric detector encapsulation base can-packaged by using a multi-layer ceramic according to an embodiment of the present invention.
Figure 2:
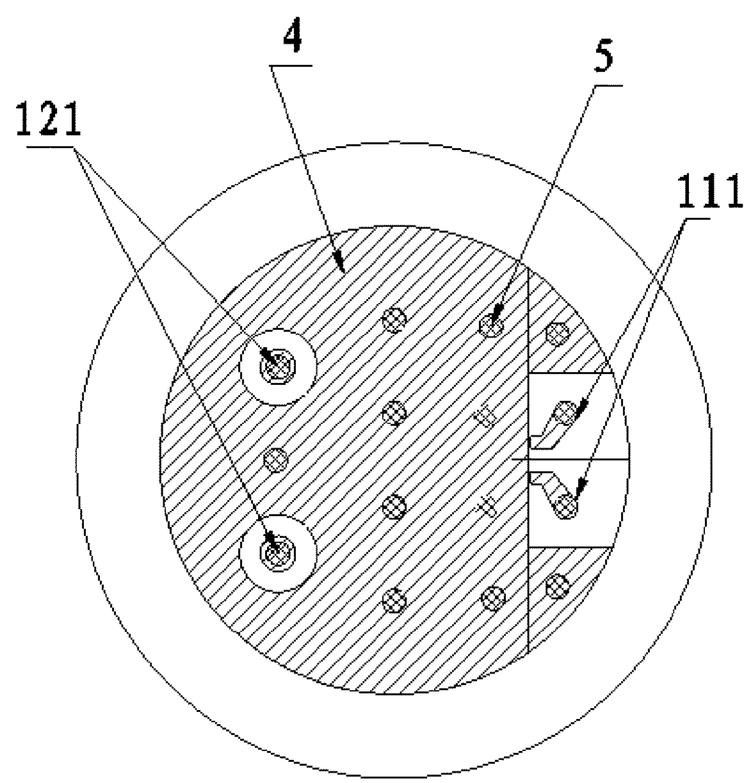
FIG. 2 is a top view of a high-frequency photoelectric detector encapsulation base can-packaged by using a multi-layer ceramic according to an embodiment of the present invention.
Figure 3:
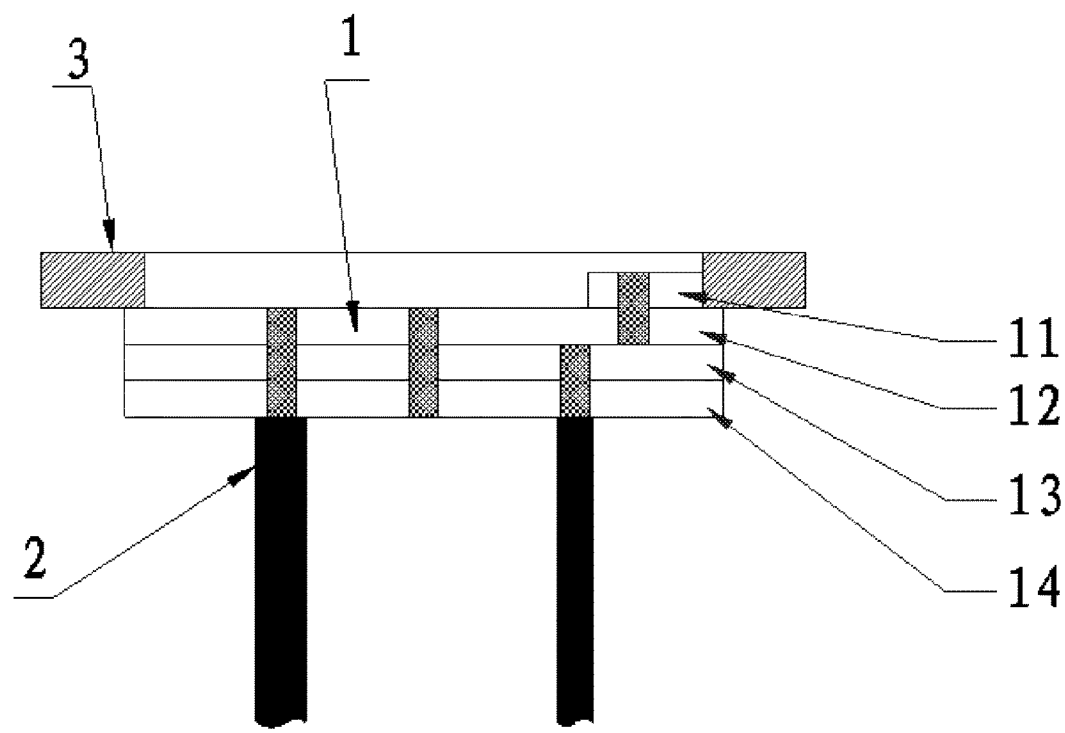
FIG. 3 is an axial sectional view of a high-frequency photoelectric detector encapsulation base can-packaged by using a multi-layer ceramic according to an embodiment of the present invention.
Figures 4A, 4B:
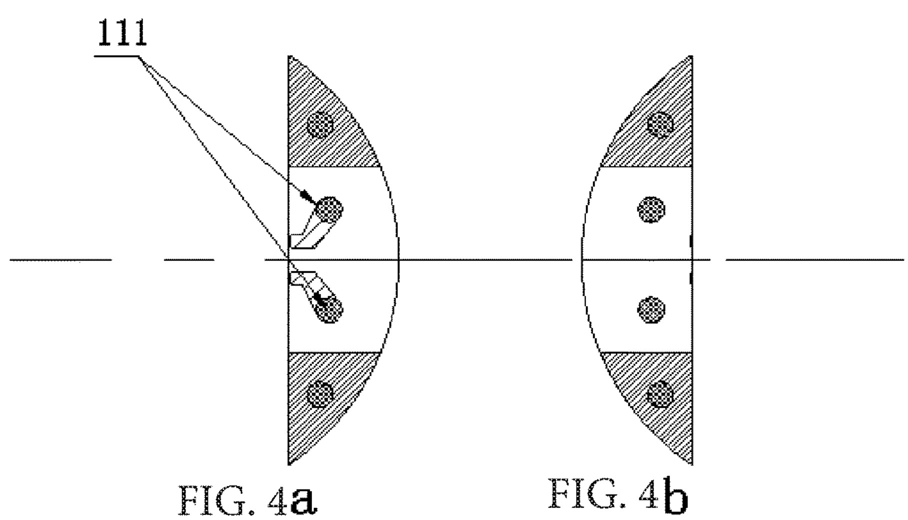
FIGS. 4*a* and 4*b* are structural views of an upper surface and a lower surface of a first ceramic substrate respectively.
Figures 5A, 5B:
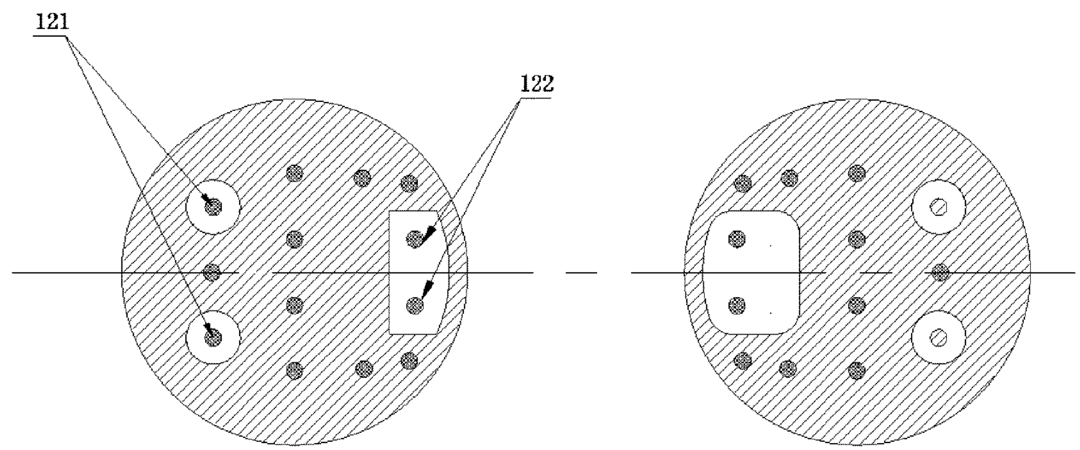
FIGS. 5*a* and 5*b* are structural views of an upper surface and a lower surface of a first ceramic substrate respectively.
Figures 6A, 6B:
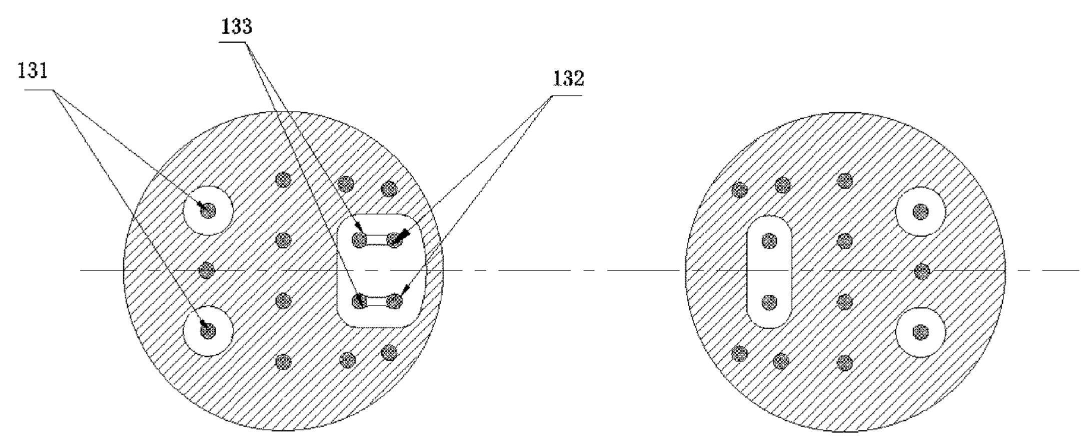
FIGS. 6*a* and 6*b* are structural views of an upper surface and a lower surface of a first ceramic substrate respectively.
Figures 7A, 7B:
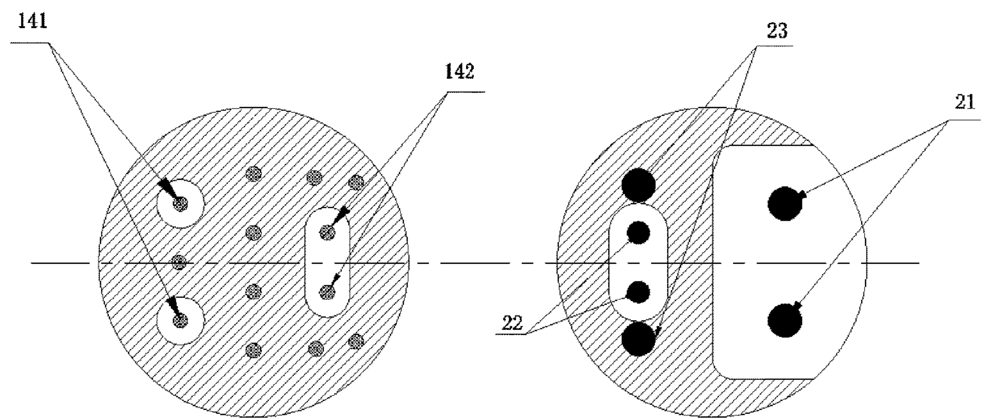
FIGS. 7*a* and 7*b* are structural views of an upper surface and a lower surface of a first ceramic substrate respectively.

FIGS. 1 to 3 illustrate a stereoscopic structure, a top-view structure and an axial sectional structure of a high-frequency photoelectric detector encapsulation base can-packaged by using a multi-layer ceramic according to an embodiment of the present invention, respectively. For ease of description, only portions related to the embodiments of the present invention are shown.

With reference to FIGS. 1 to 3, this embodiment provides a high-frequency photoelectric detector encapsulation base can-packaged by using a multi-layer ceramic, comprising a laminated multi-layer ceramic substrate 1, wherein the multi-layer ceramic substrate is welded with pins 2 at a bottom and provided with a metal ring 3 at a top; an upper surface and a lower surface of each layer of the ceramic substrate are both plated with a conductive metal layer 4; circuit connection holes 5 are distributed in each layer of the ceramic substrate, and all the layers of the ceramic substrate are combined and fixed into an integral body via the circuit connection holes; the upper surface of the multi-layer ceramic substrate is provided with two power contacts 121 and two differential signal contacts 111; the power contacts 121 and the differential signal contacts 111 penetrate through each layer of the ceramic substrate to be connected to the corresponding pins 2; and ground pins are drawn out from the lower surface of the multi-layer ceramic substrate.

In this embodiment, the metal ring is used for seam welding with a TO cap having a lens so as to bear a corresponding pressure during seal welding, and simultaneously is possible to act as a ground connection; wherein the upper and lower surfaces of each layer of the ceramic substrate are electroplated with a metal conductive layer; the circuit connection holes are internally provided with conductive metal playing a role of conductively communicating with each layer of the ceramic substrate; all the layers of the ceramic substrate are combined and fixed into an integral body via the circuit connection holes to constitute a co-plane waveguide structure; and a differential signal transmission design being adopted in a high-speed signal line to transmit a differential signal in co-plane waveguide can solve the transmission problem of a signal of higher than 20 GHz in bandwidth, with a small transmission loss and the possibility of meeting the requirement of a coaxial photoelectric detection device with a single channel of higher than 20 GHz. Specifically, when in use, a voltage source is connected from the two power contacts 121, a high-speed differential signal is connected from the two differential signal contacts 111, the voltage source penetrates through each layer of the ceramic substrate to be transmitted to the corresponding pin, and the high-speed differential signal is transmitted through all the layers of the ceramic substrate and output from the corresponding pin finally.

In the structure as described above, as a preferred embodiment, the multi-layer ceramic substrate 1 is four in layer number and comprises a first ceramic substrate 11, a second ceramic substrate 12, a third ceramic substrate 13 and a fourth ceramic substrate 14 in sequence from top to bottom, wherein six pins are used, including two power pins, two differential signal pins and two ground pins.

The structure of each layer of the ceramic substrate is described hereinafter. FIGS. 4 to 7 respectively show the structures of an upper surface and a lower surface of the first to the fourth ceramic substrates; wherein each layer of ceramic substrate is provided with contact holes for transmitting a power signal or a differential signal; a blank area for isolating the conductive metal layer is present around the power contacts, around the differential signal contacts and around the contact holes; and shaded portions in the drawings are the conductive metal layers; and a blank portion is the blank area. During signal transmission, a voltage source signal is transmitted to the power pins by passing through the power contacts and penetrating through the contact holes in each layer. The high-speed differential signal is transmitted to the differential signal pins by passing through the differential signal contacts and penetrating through the contact holes in each layer, and the voltage source signal and the high-speed differential signal here penetrate through different contact holes. In addition, preferentially, from the drawings, it can be seen that contact faces of the adjacent layers of the ceramic substrate are coincident with the blank area.

As an instance example, the first ceramic substrate 11 is D-shaped (a D shape is a graph consisting of a circular arc and a chord on the circular arc); the second to the fourth ceramic substrates are circular; the circular arc of the first ceramic substrate 11 is laminated onto an inner wall of the metal ring 3; the two differential signal contacts 111 are located on the upper surface of the first ceramic substrate 11; the two power contacts 121 are located on the upper surface of the second ceramic substrate 12; a certain range of blank area is present around both the differential signal contacts 111 and the power contacts 121; the metal conductive layer is present beyond the blank area; and the lower surface of the first ceramic substrate is symmetrical to the upper surface in terms of blank area and metal conductive layer.

The contact holes in the second ceramic substrate 12 are signal contact holes 122. The contact holes in the third ceramic substrate 13 are power contact holes 131, signal contact holes 132 and diversion contact holes 133 respectively. The contact holes in the fourth ceramic substrate 14 are power contact holes 141 and signal contact holes 142 respectively. The power contact holes 131 and 141 in the third and the fourth ceramic substrates and the power contacts 121 on the second ceramic substrate are coaxial and conducted. The power pins 21 and the power contact holes 141 in the lower surface of the fourth ceramic substrate are welded. Therefore, the voltage source input from the power contacts 121 can be output from the power pins 21.

The signal contact holes 122 and 132 in the second and the third ceramic substrates and the differential signal contacts 111 on the first ceramic substrate are coaxial and conducted. The diversion contact holes 133 in the third ceramic substrate and the signal contact holes 142 in the fourth ceramic substrate are coaxial and conducted. The diversion contact holes 133 and the signal contact holes 131 in the third ceramic substrate are in one-to-one electric connection; the differential signal pins 22 and the signal contact holes 142 in the lower surface of the fourth ceramic substrate are welded. The ground pins 23 are welded to the metal conductive layer on the lower surface of the fourth ceramic substrate. In such a way, the high-speed differential signal input from the differential signal contacts 111 can be output from the differential signal pins 22.

In this embodiment, a distance between the circuit connection holes in each layer of the ceramic substrate and the blank area is more than a safety distance value, thereby preventing the signal transmission from being influenced. In addition, as a preferred embodiment, the metal conductive layer is made from gold, which exhibits a good conductive property; and the multi-layer ceramic substrate constitutes co-plane waveguide having a better shielding property, thereby being possible to further promote the signal transmission. Finally, the present invention is compatible with a common tank-type encapsulation base in outline structure, is compatible with the mature process in the prior art, and is easy for mass production, thereby reducing the cost.

Described above are only preferred embodiments of the present invention, but are not intended to limit the present invention. Any modifications, equivalent substitutions, improvements and others made within the spirit and principle of the present invention are construed to be incorporated within the protection scope of the present invention.

What is claimed is:

1. A high-frequency photoelectric detector encapsulation base can-packaged by using a multi-layer ceramic, comprising a laminated multi-layer ceramic substrate, the multi-layer ceramic substrate is welded with pins at a bottom and provided with a metal ring at a top; an upper surface and a lower surface of each layer of the ceramic substrate are both plated with a conductive metal layer; circuit connection holes are distributed in each layer of the ceramic substrate, and all the layers of the ceramic substrate are combined and fixed into an integral body via the circuit connection holes; the upper surface of the multi-layer ceramic substrate is provided with two power contacts and two differential signal contacts, the power contacts and the differential signal contacts penetrating through each layer of the ceramic substrate to be connected to the corresponding pins, and ground pins being ledout from the lower surface of the multi-layer ceramic substrate, wherein the multi-layer ceramic substrate has four layers, comprising a first ceramic substrate, a second ceramic substrate, a third ceramic substrate and a fourth ceramic substrate in sequence from top to bottom; six pins are used, comprising two power pins, two differential signal pins, and two ground pins; each layer of the ceramic substrate is provided with contact holes; a blank area for isolating the conductive metal layers is present around the power contacts, around the differential signal contacts and around the contact holes; and the power contacts and the differential signal contacts penetrate through the contact holes of each layer to be connected to the corresponding pins, wherein the contact faces of adjacent layers of the ceramic substrate are coincident with the blank area, and wherein the first ceramic substrate is D-shaped; the second to the fourth ceramic substrates are circular; a circular arc of the first ceramic substrate is laminated onto an inner wall of the metal ring; the two differential signal contacts are located on the upper surface of the first ceramic substrate; the two power contacts are located on the upper surface of the second ceramic substrate; a certain range of blank area is present around both the differential signal contacts and the power contacts; the metal conductive layer is present beyond the blank area; and the lower surface of the first ceramic substrate is symmetrical to the upper surface in terms of the blank area and the metal conductive layer.

2. The high-frequency photoelectric detector encapsulation base according to claim 1, wherein the contact holes in the second ceramic substrate are signal contact holes; the contact holes in the third ceramic substrate are power contact holes, signal contact holes and diversion contact holes respectively; the contact holes in the fourth ceramic substrate are power contact holes and signal contact holes respectively; and the power contact holes in the third and fourth ceramic substrates and the power contacts on the second ceramic substrate are coaxial and conducted.

3. The high-frequency photoelectric detector encapsulation base according to claim 2, wherein the signal contact holes in the second and the third ceramic substrates and the differential signal contacts on the first ceramic substrate are coaxial and conducted; the diversion contact holes in the third ceramic substrate and the signal contact holes in the fourth ceramic substrate are coaxial and conducted; and the diversion contact holes and the signal contact holes in the third ceramic substrate are in one-to-one electric connection.

4. The high-frequency photoelectric detector encapsulation base according to claim 3, wherein the power pins and the power contact holes in the lower surface of the fourth ceramic substrate are welded; the differential signal pins and the signal contact holes in the lower surface of the fourth ceramic substrate are welded; and the ground pins are welded to the metal conductive layer on the lower surface of the fourth ceramic substrate.

5. The high-frequency photoelectric detector encapsulation base according to claim 1, wherein a distance between the circuit connection holes in each layer of the ceramic substrate and the blank area is more than a safety distance value, thereby preventing the signal transmission from being influenced.

6. The high-frequency photoelectric detector encapsulation base according to claim 5, wherein the conductive metal layers are made from gold.

7. The high-frequency photoelectric detector encapsulation base according to claim 2, wherein a distance between the circuit connection holes in each layer of the ceramic substrate and the blank area is more than a safety distance value, thereby preventing the signal transmission from being influenced.

8. The high-frequency photoelectric detector encapsulation base according to claim 3, wherein a distance between the circuit connection holes in each layer of the ceramic substrate and the blank area is more than a safety distance value, thereby preventing the signal transmission from being influenced.

9. The high-frequency photoelectric detector encapsulation base according to claim 4, wherein a distance between the circuit connection holes in each layer of the ceramic substrate and the blank area is more than a safety distance value, thereby preventing the signal transmission from being influenced.

* * * * *